(12) United States Patent
Takewaki et al.

(10) Patent No.: US 11,271,352 B2
(45) Date of Patent: Mar. 8, 2022

(54) POWER SEMICONDUCTOR DEVICE AND MANUFACTURING METHOD THEREOF, AND POWER CONVERSION DEVICE

(71) Applicant: Mitsubishi Electric Corporation, Tokyo (JP)

(72) Inventors: Yoshiaki Takewaki, Tokyo (JP); Yoshihisa Uchida, Tokyo (JP); Yo Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 28 days.

(21) Appl. No.: 16/442,755

(22) Filed: Jun. 17, 2019

(65) Prior Publication Data
US 2020/0052449 A1    Feb. 13, 2020

(30) Foreign Application Priority Data

Aug. 8, 2018    (JP) .............................. JP2018-148968

(51) Int. Cl.
*H01R 43/02*    (2006.01)
*H01L 23/498*    (2006.01)
(Continued)

(52) U.S. Cl.
CPC .... *H01R 43/0221* (2013.01); *H01L 23/49811* (2013.01); *H01R 4/029* (2013.01);
(Continued)

(58) Field of Classification Search
CPC ........... H01L 23/49811; H01L 21/4825; H01L 29/7393; H02M 7/003; H02M 7/5387;
(Continued)

(56) References Cited

U.S. PATENT DOCUMENTS 9,949,385 B2 *    4/2018    Hartmann ............ H05K 5/0034
2010/0295187 A1 *    11/2010    Tsuruoka ................ H01L 24/37
257/773
(Continued)

FOREIGN PATENT DOCUMENTS

EP    2571053 A1    3/2013
JP    H07-094845 A    4/1995
(Continued)

OTHER PUBLICATIONS

An Office Action; "Notice of Reasons for Refusal", mailed by the Japanese Patent Office dated Jun. 29, 2021, which corresponds to Japanese Patent Application No. 2018-148968 and is related to U.S. Appl. No. 16/442,755; with English language translation.

*Primary Examiner* — Savitri Mulpuri
(74) *Attorney, Agent, or Firm* — Studebaker & Brackett PC

(57) ABSTRACT

The object is to provide a technology capable of increasing the reliability of a power semiconductor device. A power semiconductor device includes: a substrate including an insulating layer and a circuit pattern that are disposed in this order; a power semiconductor element electrically connected to the circuit pattern; and an electrode terminal having a thinned portion including a welded portion welded to the circuit pattern by a fiber laser. A thickness of the circuit pattern is not less than 0.2 and not more than 0.5 mm, and a thickness of the thinned portion of the electrode terminal is not less than one time and not more than two times the thickness of the circuit pattern.

5 Claims, 4 Drawing Sheets

(51) Int. Cl.
    *H01R 12/51*     (2011.01)
    *H01R 4/02*     (2006.01)
    *H02M 7/5387*     (2007.01)
    *H05K 1/18*     (2006.01)
    *H05K 1/09*     (2006.01)
    *H05K 3/32*     (2006.01)
    *H02M 1/08*     (2006.01)
    *H01L 29/739*     (2006.01)

(52) U.S. Cl.
    CPC .............. *H01R 12/51* (2013.01); *H02M 1/08* (2013.01); *H02M 7/5387* (2013.01); *H05K 1/09* (2013.01); *H05K 1/181* (2013.01); *H05K 3/328* (2013.01); *H01L 29/7393* (2013.01); *H05K 2201/10166* (2013.01); *H05K 2203/107* (2013.01)

(58) Field of Classification Search
    CPC ..... H02M 1/08; H01R 43/0221; H01R 12/51; H01R 4/029; H05K 1/181; H05K 2203/107; H05K 2201/10166; H05K 1/09; H05K 3/328
    See application file for complete search history.

(56) References Cited

U.S. PATENT DOCUMENTS

2016/0293563 A1*    10/2016    Fujino .................... H01L 24/48
2017/0312853 A1     11/2017    Kabelitz et al.
2018/0063955 A1*     3/2018    Werley .................. H05K 1/181

FOREIGN PATENT DOCUMENTS

JP     H07-273267 A     10/1995
JP     2018-500172 A     1/2018

* cited by examiner

F I G. 7
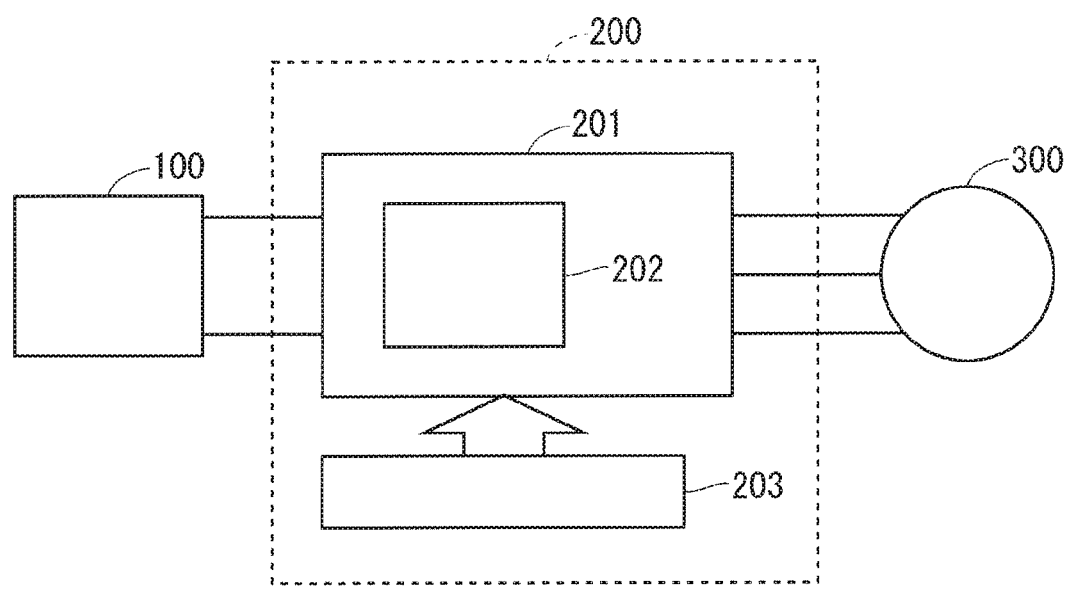

US 11,271,352 B2

POWER SEMICONDUCTOR DEVICE AND MANUFACTURING METHOD THEREOF, AND POWER CONVERSION DEVICE

FIELD OF THE INVENTION

The present invention relates to a power semiconductor device and a manufacturing method thereof, and a power conversion device.

DESCRIPTION OF THE BACKGROUND ART

Laser welding is sometimes applied to power semiconductor devices such as a power module including a power semiconductor element to strengthen a joint between a circuit pattern laid on the surface of an insulating layer and an electrode terminal. For example, Japanese Patent Application Laid-Open No. H7-94845 proposes a technology for thinning at least a portion of a tip of an electrode terminal such as a lead more than the other portions and welding the thinned portion. Since such a technology yields satisfactory thermal conductivity in the welding, the welding increases the strength of the joint, thus resulting in increase in the reliability and increase in the productivity with the shortened weld time.

However, excessively thinning the electrode terminal causes a problem of weakening the mechanical strength of the electrode terminal itself. Although excessively thickening the electrode terminal increases the mechanical strength of the electrode terminal itself, a high-energy laser for jointing the thick electrode terminal and the circuit pattern may create a problem of a breakage in the insulating layer under the circuit pattern.

SUMMARY

The present invention has been conceived in view of the problems, and the object is to provide a technology capable of increasing the reliability of a power semiconductor device.

A power semiconductor device includes: a substrate including an insulating layer and a circuit pattern that are disposed in this order; a power semiconductor element electrically connected to the circuit pattern; and an electrode terminal having a thinned portion including a welded portion welded to the circuit pattern by a fiber laser, wherein a thickness of the circuit pattern is not less than 0.2 and not more than 0.5 mm, and a thickness of the thinned portion of the electrode terminal is not less than one time and not more than two times the thickness of the circuit pattern.

Thus, the reliability of the power semiconductor device can be increased.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a block diagram illustrating a configuration of a power conversion system to which the power conversion device according to Preferred Embodiment 5 is applied.

DESCRIPTION OF THE PREFERRED EMBODIMENTS

Preferred Embodiment 1

Before describing a power semiconductor device according to Preferred Embodiment 1 of the present invention, a semiconductor device relevant to this power semiconductor device (hereinafter referred to as a "relevant semiconductor device") will be described.

Figure 1:
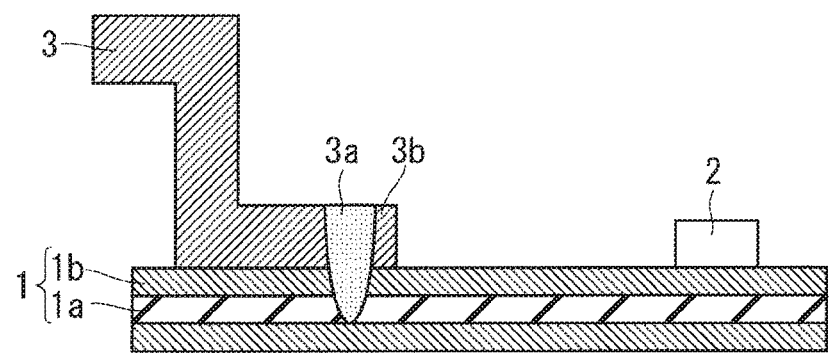
FIG. 1 is a cross-sectional view schematically illustrating a part of a structure of a relevant semiconductor device.

FIG. 1 is a cross-sectional view schematically illustrating a part a structure of the relevant semiconductor device. The relevant semiconductor device includes a substrate 1 such as an insulating substrate, a power semiconductor element 2, and an electrode terminal 3.

The substrate 1 includes an insulating layer 1a and a circuit pattern 1b that are disposed in this order. The insulating layer 1a contains, for example, ceramics and a resin. The circuit pattern 1b contains, for example, a conductive material such as a metal. Although not illustrated, the circuit patterns 1b are electrically connected through, for example, an aluminum wire.

The power semiconductor element 2 is disposed on the circuit pattern 1b through a solder that is not illustrated, to be electrically connected to the circuit pattern 1b. The power semiconductor element 2 is, for example, an insulated-gate bipolar transistor (IGBT).

The electrode terminal 3 is, for example, a lead formed by bending a plate-shaped material. While one end portion of the electrode terminal 3 is in contact with the circuit pattern 1b, irradiating the side opposite to the circuit pattern 1b with laser beam enables the electrode terminal 3 to be welded to the circuit pattern 1.

The aforementioned structure is covered with a package such as a case that is not illustrated, together with a sealing material such as gel for protecting the structure, which is not illustrated.

The electrode terminal 3 of the relevant semiconductor device is relatively thick. A high-energy laser is necessary for welding the electrode terminal 3 and the circuit pattern 1b. Although the high-energy laser can weld the electrode terminal 3 and the circuit pattern 1b, the high-energy laser may break the insulating layer 1b with a welded portion 3a running downward as illustrated in FIG. 1. In contrast, when the electrode terminal 3 is thin, the mechanical strength of the electrode terminal 3 itself decreases. Thus, the power semiconductor device according to Preferred Embodiment 1 can solve such a problem as described below.

Figure 2:
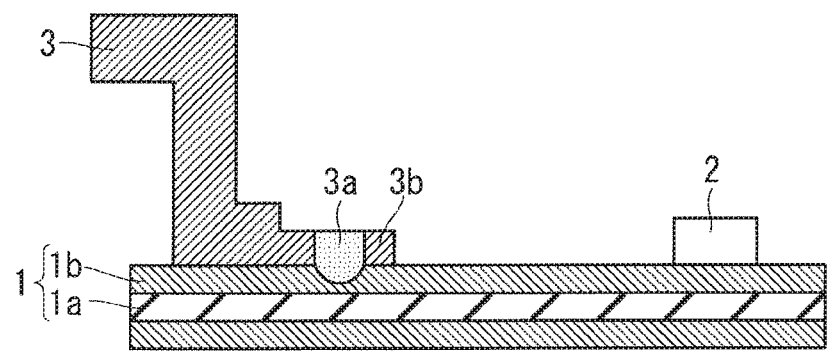
FIG. 2 is a cross-sectional view schematically illustrating a part of a structure of a power semiconductor device according to Preferred Embodiment 1.

FIG. 2 is a cross-sectional view schematically illustrating a part of a structure of the power semiconductor device according to Preferred Embodiment 1. Among the constituent elements according to Preferred Embodiment 1, the same or similar constituent elements as those described above will have the same reference numerals, and the different constituent elements will be mainly described.

The electrode terminal 3 has a thinned portion 3b. This thinned portion 3b includes the welded portion 3a welded to the circuit pattern 1b by a laser. The laser for performing such welding according to Preferred Embodiment 1 is a fiber laser with superior beam quality. The fiber laser can stably weld minute areas, and also perform welding even when the circuit pattern 1b is made of, for example, a refractory material such as copper (Cu) and aluminum (Al).

Figure 3:
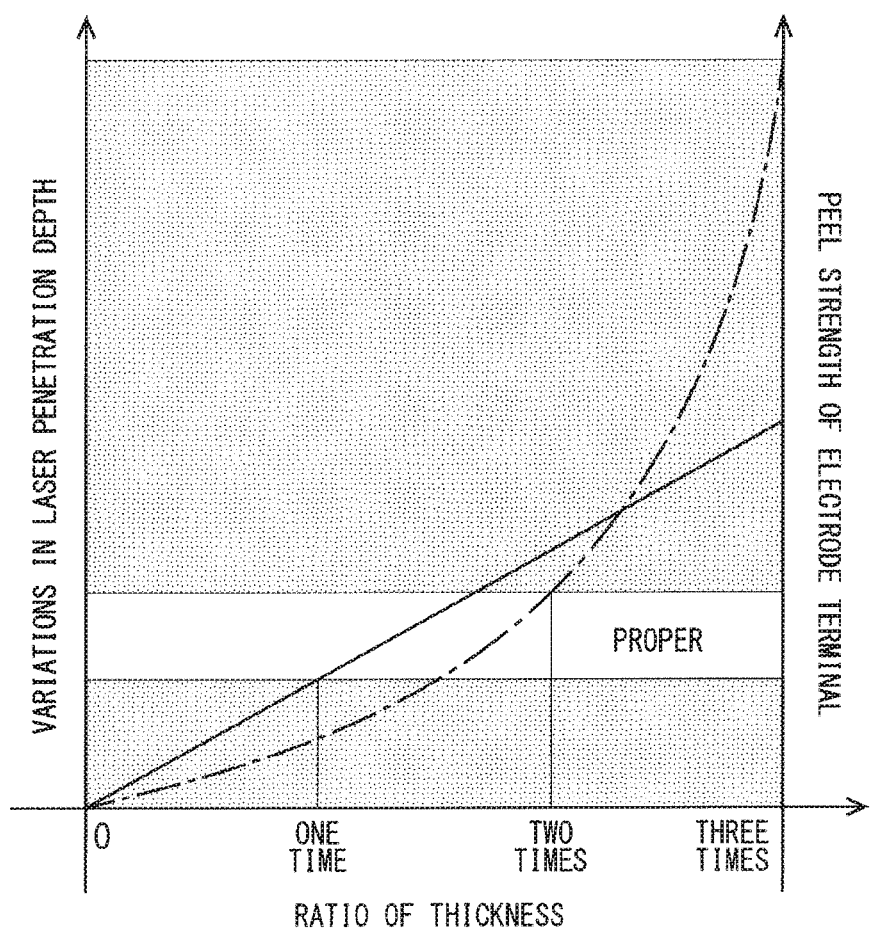
FIG. 3 illustrates a result of investigating the peel strength and variations in the depth of a welded portion.

Here, the peel strength and variations in the depth of the welded portion 3a were investigated in such a structure. FIG. 3 illustrates the result. The solid line indicates the peel strength, whereas the alternate long and short dashed line indicates the variations in the depth of the welded portion 3a. The horizontal axis in FIG. 3 represents a ratio of the thickness of the electrode terminal 3 to the thickness of the circuit pattern 1b. When the thickness of the circuit pattern 1b is not less than 0.2 and not more than 0.5 mm, a result similar to that illustrated in FIG. 3 was obtained.

We found that the lower hatching area in FIG. 3 exhibits insufficient peel strength, lacking current capacity, and high probability of short life. We also found that the upper hatching area in FIG. 3 exhibits wide variations in the welded portion 3a and high probability of destroying the insulating layer 1a. Here, a thickness of the thinned portion 3b of the electrode terminal 3 is not less than one time and not more than two times the thickness of the circuit pattern 1b according to Preferred Embodiment 1.

Conclusion of Preferred Embodiment 1

Since the fiber laser with superior beam quality is applies to the power semiconductor device according to Preferred Embodiment 1, it can stably weld minute areas, and also perform welding even when the circuit pattern 1b is made of a refractory material. The thickness of the thinned portion 3b of the electrode terminal 3 according to Preferred Embodiment 1 is not less than one time and not more than two times the thickness of the circuit pattern 1b. Consequently, increase in the peel strength, prevention of the lacking current capacity and the decrease in life, and decrease in the probability of destroying the insulating layer 1a can be expected. Thus, the reliability of the power semiconductor device can be increased.

Modifications

Although the die bond material between the power semiconductor element 2 and the circuit pattern 1b according to Preferred Embodiment 1 is a solder, it is not limited to such but may be a sintered joint material containing Ag (silver) particles or Cu (copper) particles. The structure containing the sintered joint material as a die bond material can increase the life of a joint portion between the power semiconductor element 2 and the circuit pattern 1b more than the structure containing the solder as the die bond material.

Although the power semiconductor element is an IGBT according to Preferred Embodiment 1, it is not limited to such. The power semiconductor element 2 may include at least one of, for example, the IGBT, a metal-oxide semiconductor field-effect transistor (MOSFET), a free-wheeling diode (FWD), and a Schottky barrier diode (SBD).

Although the power semiconductor element 2 is disposed on the circuit pattern 1b according to Preferred Embodiment 1, it is not limited to such. The power semiconductor element 2 has only to be electrically connected to the circuit pattern 1b, and, for example, another conductive material may be disposed between the power semiconductor element 2 and the circuit pattern 1b.

Preferred Embodiment 2

Figure 4:
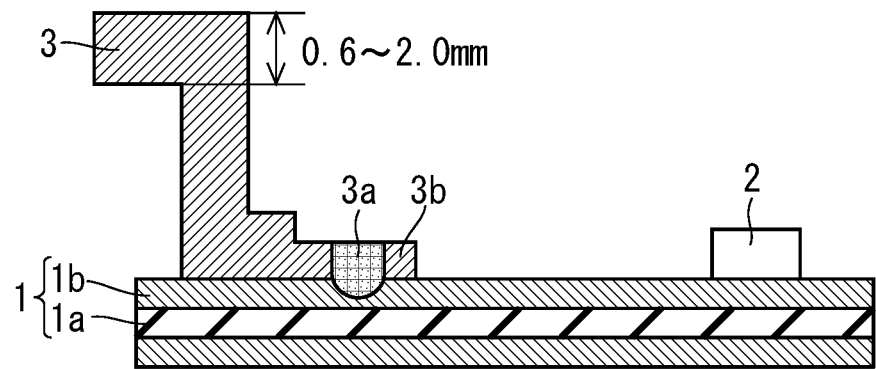
FIG. 4 is a cross-sectional view schematically illustrating a part of a structure of a power semiconductor device according to Preferred Embodiment 2.

FIG. 4 is a cross-sectional view schematically illustrating a part of a structure of a power semiconductor device according to Preferred Embodiment 2 of the present invention. Among the constituent elements according to Preferred Embodiment 2, the same or similar constituent elements as those described above will have the same reference numerals, and the different constituent elements will be mainly described.

According to Preferred Embodiment 2, the thickness of the electrode terminal 3 except for the thinned portion 3b is not less than 0.6 and not more than 2.0 mm, and the power semiconductor element 2 contains SiC (silicon carbide) that is a wide-bandgap semiconductor. The electrode terminal 3 having a relatively large cross-sectional area in such a structure enables a high current to flow through the power semiconductor device 2. SiC with superior heat resistance also enables the high current to flow through the power semiconductor device 2. As a result, miniaturization of the package or the power semiconductor device 2 can be expected.

Although the wide-bandgap semiconductor is SiC in the aforementioned description, it is not limited to such. The wide-bandgap semiconductor may be, for example, gallium nitride (GaN) or diamond.

Preferred Embodiment 3

Figure 5:
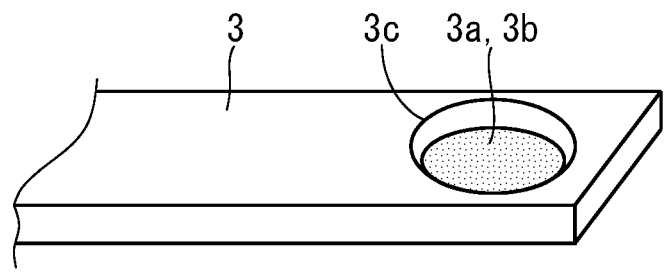
FIG. 5 is a perspective view schematically illustrating a part of a structure of a power semiconductor device according to Preferred Embodiment 3.

FIG. 5 is a perspective view schematically illustrating a part of a structure of a power semiconductor device (an electrode terminal) according to Preferred Embodiment 3 of the present invention. Among the constituent elements according to Preferred Embodiment 3, the same or similar constituent elements as those described above will have the same reference numerals, and the different constituent elements will be mainly described.

The thinned portion 3b is identical in shape to the welded portion 3a in a plan view according to Preferred Embodiment 3. In other words, the thinned portion 3b only consists of the welded portion 3a in a plan view. Although the thinned portion 3b is not formed in the periphery of the electrode terminal 3 in the example of FIG. 5, the electrode terminal has a recess 3c with the bottom which is the thinned portion 3b.

Since only the welded portion 3a that is a laser joint portion in the electrode terminal 3 is thin in the power semiconductor device according to Preferred Embodiment 3, increase in the stress resistance and in the joint reliability can be expected more than those according to Preferred Embodiment 1. Since the current capacity of the power semiconductor device can be increased, miniaturization of the package or the power semiconductor device can be expected.

Preferred Embodiment 4

Figure 6:
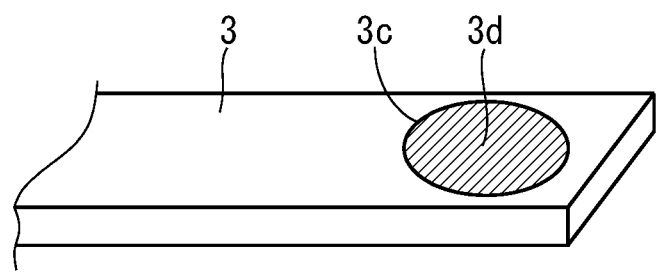
FIG. 6 is a perspective view schematically illustrating a part of a structure of a power semiconductor device according to Preferred Embodiment 4.

FIG. 6 is a perspective view schematically illustrating a part of a structure of a power semiconductor device (an electrode terminal) according to Preferred Embodiment 4 of the present invention. Among the constituent elements according to Preferred Embodiment 4, the same or similar constituent elements as those described above will have the same reference numerals, and the different constituent elements will be mainly described.

The power semiconductor device according to Preferred Embodiment 4 includes a conductive material 3d embedded in the recess 3c, in addition to the structure according to Preferred Embodiment 3. The conductive material 3d contains at least one of, for example, a Cu paste and an Ag paste. The structure illustrated in FIG. 6 is formed by, for example, welding the thinned portion 3b to the circuit pattern 1b by the laser and then embedding the conductive material 3d in the recess 3c.

The power semiconductor device according to Preferred Embodiment 4 can substantially increase the cross-sectional area of the electrode terminal 3 through which a current flows. Since a high current can flow through the power semiconductor device, miniaturization of the package or the power semiconductor device can be expected.

Preferred Embodiment 5

The power conversion device according to Preferred Embodiment 5 of the present invention is a power conversion device including a main conversion circuit including the power semiconductor device according to one of Preferred Embodiments 1 to 4. Although the power semiconductor devices described above are not limited to specific power conversion devices, Preferred Embodiment 5 will describe application of the power semiconductor device according to one of Preferred Embodiments 1 to 4 to a three-phase inverter.

FIG. 7 is a block diagram illustrating a configuration of a power conversion system to which the power conversion device according to Preferred Embodiment 5 is applied.

The power conversion system illustrated in FIG. 7 includes a power supply 100, a power conversion device 200, and a load 300. The power supply 100, which is a DC power supply, supplies a DC power to the power conversion device 200. The power supply 100 may be one of various power supplies including a DC system, a solar battery, and a rechargeable battery, or a rectifying circuit connected to an AC system and an AC/DC converter. The power supply 100 may include a DC/DC converter which converts the DC power output from a DC system into a predetermined power.

The power conversion device 200, which is a three-phase inverter connected between the power supply 100 and the load 300, converts the DC power supplied from the power supply 100 into the AC power to supply the AC power to the load 300. As illustrated in FIG. 7, the power conversion device 200 includes a main conversion circuit 201 that converts the DC power into the AC power, and a control circuit 203 that outputs, to the main conversion circuit 201, a control signal for controlling the main conversion circuit 201.

The load 300 is a three-phase electrical motor driven by the AC power supplied from the power conversion device 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power conversion device 200 will be described in detail hereinafter. The main conversion circuit 201 includes switching elements and free-wheeling diodes (not shown). The main conversion circuit 201 converts the DC power supplied from the power supply 100 into the AC power by switching of the switching elements, and then supplies the AC power to the load 300. The specific circuit configuration of the main conversion circuit 201 is of various types. The main conversion circuit 201 according to Preferred Embodiment 5 is a three-phase full-bridge circuit having two levels, and may include six switching elements and six free-wheeling diodes anti-parallel connected to the respective switching elements. At least one of the switching elements and the free-wheeling diodes of the main conversion circuit 201 includes a drive circuit 202 to which the power semiconductor device according to one of Preferred Embodiments 1 to 4 is applied. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates drive signals for driving the switching elements of the main conversion circuit 201, and provides the drive signals to control electrodes of the switching elements of the main conversion circuit 201. Specifically, the driving circuit 202 outputs the drive signal for switching each of the switching elements to an ON state and the drive signal for switching the switching element to an OFF state, to a control electrode of the switching element in accordance with the control signal from the control circuit 203 to be described hereinafter. When the switching element is kept in the ON state, the drive signal is a voltage signal (ON signal) higher than or equal to a threshold voltage of the switching element. When the switching element is kept in the OFF state, the drive signal is a voltage signal (OFF signal) lower than the threshold voltage of the switching element.

The control circuit 203 controls the switching elements of the main conversion circuit 201 to supply a desired power to the load 300. Specifically, the control circuit 203 calculates a time (ON time) when each of the switching elements of the main conversion circuit 201 needs to enter the ON state, based on the power to be supplied to the load 300. For example, the control circuit 203 can control the main conversion circuit 201 by performing pulse width modulation (PWM) control for modulating the ON time of the switching elements in accordance with the voltage to be output. Then, the control circuit 203 outputs a control instruction (control signal) to the drive circuit 202 included in the main conversion circuit 201 so that the drive circuit 202 outputs the ON signal to the switching element which needs to enter the ON state and outputs the OFF signal to the switching element which needs to enter the OFF state at each time. The drive circuit 202 outputs the ON signal or the OFF signal as the drive signal to the control electrode of each of the switching elements in accordance with this control signal.

Since the power conversion device according to Preferred Embodiment 5 applies the power semiconductor device according to one of Preferred Embodiments 1 to 4 as at least one of the switching elements and the free-wheeling diodes of the main conversion circuit 201, the reliability can be increased.

Although Preferred Embodiment 5 describes the example of applying the power semiconductor device according to one of Preferred Embodiments 1 to 4 to the three-phase inverter having the two levels, Preferred Embodiment 5 is not limited thereto, but can be applied to various power conversion devices. Although Preferred Embodiment 5 describes the power semiconductor device according to one of Preferred Embodiments 1 to 4 as the power conversion device having the two levels, the power conversion device may have three or multiple levels. The power semiconductor devices may be applied to a single-phase inverter when the power is supplied to a single-phase load. Embodiments herein can also be applied to a DC/DC converter or an AC/DC converter when the power is supplied to, for example, a DC load.

The load of the power conversion device according to Preferred Embodiment 5 is not limited to the electrical motor as described above. The power conversion device can also be used as a power-supply device of, for example, an electrical discharge machine, a laser beam machine, an induction heat cooking device, or a non-contact power feeding system, and can be further used as a power conditioner of, for example, a solar power system or an electricity storage system.

Embodiments and modifications can be freely combined, and appropriately modified or omitted within the scope of the present invention.

What is claimed is:

1. A power semiconductor device, comprising:
    a substrate including an insulating layer and a circuit pattern that are disposed in this order;
    a power semiconductor element electrically connected to the circuit pattern; and
    an electrode terminal having a thinned portion including a welded portion welded to the circuit pattern,
    wherein a thickness of the circuit pattern is not less than 0.2 and not more than 0.5 mm,
    a thickness of the thinned portion of the electrode terminal is not less than one time and not more than two times the thickness of the circuit pattern,
    the electrode terminal has a recess with a bottom which is the thinned portion, and
    the power semiconductor device further comprises a conductive material embedded in the recess.

2. The power semiconductor device according to claim 1, wherein the conductive material contains at least one of a Cu paste and an Ag paste.

3. A method for manufacturing a power semiconductor device, the method comprising:
    preparing a substrate including an insulating layer and a circuit pattern that are disposed in this order;
    electrically connecting a power semiconductor element to the circuit pattern; and
    welding a thinned portion of an electrode terminal to the circuit pattern by a fiber laser,
    wherein a thickness of the circuit pattern is not less than 0.2 and not more than 0.5 mm,
    a thickness of the thinned portion of the electrode terminal is not less than one time and not more than two times the thickness of the circuit pattern,
    the electrode terminal has a recess with a bottom which is the thinned portion, and
    the power semiconductor device further comprises a conductive material embedded in the recess.

4. The power semiconductor device according to claim 1, wherein a thickness of the electrode terminal except for the thinned portion is not less than 0.6 and not more than 2.0 mm, and
    the power semiconductor element includes a wide-band-gap semiconductor.

5. The method for manufacturing a power semiconductor device according to claim 3,
    wherein a thickness of the electrode terminal except for the thinned portion is not less than 0.6 and not more than 2.0 mm, and
    the power semiconductor element includes a wide-band-gap semiconductor.

* * * * *